(12) United States Patent
Standing et al.

(10) Patent No.: US 9,974,190 B2
(45) Date of Patent: May 15, 2018

(54) SYSTEM AND METHOD OF PROVIDING A SEMICONDUCTOR CARRIER AND REDISTRIBUTION STRUCTURE

(71) Applicant: Infineon Technologies Austria AG, Villach (AT)

(72) Inventors: Martin Standing, Velden (AT); Andrew Roberts, Denbigh (GB)

(73) Assignee: Infineon Technologies Austria AG, Villach (AT)

( * ) Notice: Subject to any disclaimer, the term of this patent is extended or adjusted under 35 U.S.C. 154(b) by 36 days.

(21) Appl. No.: 14/533,448

(22) Filed: Nov. 5, 2014

(65) Prior Publication Data

US 2016/0128197 A1    May 5, 2016

(51) Int. Cl.
| | |
|---|---|
| H05K 1/00 | (2006.01) |
| H05K 3/32 | (2006.01) |
| H05K 1/14 | (2006.01) |
| H05K 1/02 | (2006.01) |
| H05K 1/18 | (2006.01) |

(52) U.S. Cl.
CPC ............ *H05K 3/32* (2013.01); *H05K 1/141* (2013.01); *H05K 1/144* (2013.01); *H05K 1/0204* (2013.01); *H05K 1/0209* (2013.01); *H05K 1/185* (2013.01); *H05K 2201/041* (2013.01)

(58) Field of Classification Search
None
See application file for complete search history.

(56) References Cited

U.S. PATENT DOCUMENTS

| | | |
|---|---|---|
| 3,340,587 A | 9/1967 | Beyer et al. |
| 4,563,725 A | 1/1986 | Kirby |
| 4,648,008 A | 3/1987 | Neyroud et al. |
| 4,803,545 A | 2/1989 | Birkle et al. |
| 4,858,479 A | 8/1989 | Voss et al. |
| 4,879,434 A | 11/1989 | Assel et al. |
| 4,906,201 A | 3/1990 | Young et al. |
| 5,099,550 A | 3/1992 | Beane et al. |
| 5,138,529 A | 8/1992 | Colton et al. |
| 5,164,543 A | 11/1992 | Benson et al. |
| 5,235,492 A | 8/1993 | Humbert et al. |
| 5,237,485 A | 8/1993 | Cognetti de Martiis et al. |
| 5,251,101 A | 10/1993 | Liu |

(Continued)

FOREIGN PATENT DOCUMENTS

| | | |
|---|---|---|
| CN | 101976664 A | 2/2011 |
| CN | 102740646 A | 10/2012 |
| CN | 103311193 A | 9/2013 |

*Primary Examiner* — Courtney Smith
(74) *Attorney, Agent, or Firm* — Murphy, Bilak & Homiller, PLLC

(57) ABSTRACT

In an embodiment, a method includes arranging a first carrier on a first major surface of a circuit board such that an electronic component arranged on the first carrier is positioned in an aperture in the circuit board and spaced apart from side walls of the aperture, and arranging a second carrier on a second major surface of the circuit board such that the second carrier covers the electronic component and the aperture, the second major surface of the circuit board opposing the first major surface of the circuit board. The electronic component includes a power semiconductor device embedded in a dielectric core layer and at least one contact pad arranged on a first major surface of the dielectric core layer.

19 Claims, 4 Drawing Sheets

(56) References Cited

U.S. PATENT DOCUMENTS

| | | |
|---|---|---|
| 5,344,113 A | 9/1994 | Jurek et al. |
| 5,450,284 A | 9/1995 | Wekell |
| 5,506,612 A | 4/1996 | Ogata et al. |
| 5,557,064 A | 9/1996 | Isern-Flecha et al. |
| 5,594,204 A | 1/1997 | Taylor et al. |
| 5,699,229 A | 12/1997 | Brownell |
| 5,699,954 A | 12/1997 | Bell et al. |
| 5,747,735 A | 5/1998 | Chang et al. |
| 5,796,583 A | 8/1998 | Gale et al. |
| 5,821,762 A | 10/1998 | Hamaguchi et al. |
| 5,847,928 A | 12/1998 | Hinshaw et al. |
| 6,078,500 A | 6/2000 | Beaman et al. |
| 6,111,746 A | 8/2000 | Wahl et al. |
| 6,111,752 A | 8/2000 | Huang et al. |
| 6,171,151 B1 | 1/2001 | Lu et al. |
| 6,321,443 B1 | 11/2001 | Barte et al. |
| 6,362,965 B2 | 3/2002 | Bookhardt et al. |
| 6,381,813 B1 | 5/2002 | Lai |
| 6,408,352 B1 | 6/2002 | Hosaka et al. |
| 6,431,259 B2 | 8/2002 | Hellbrueck et al. |
| 6,465,728 B1 | 10/2002 | Annis et al. |
| 6,523,252 B1 | 2/2003 | Lipponen |
| 6,539,618 B1 | 4/2003 | Lyke et al. |
| 6,587,344 B1 | 7/2003 | Ross |
| 6,893,268 B1 | 5/2005 | Harari et al. |
| 6,945,786 B2 | 9/2005 | Ammar et al. |
| 7,012,809 B2 | 3/2006 | Han et al. |
| 7,021,971 B2 | 4/2006 | Chou et al. |
| 7,186,925 B2 | 3/2007 | Tsukahara et al. |
| 7,203,066 B2 | 4/2007 | Lee et al. |
| 7,360,365 B2 | 4/2008 | Codecasa et al. |
| 7,469,457 B2 | 12/2008 | Saitou et al. |
| 7,518,873 B2 | 4/2009 | Park et al. |
| 7,537,458 B2 | 5/2009 | Idzik et al. |
| 8,156,644 B2 | 4/2012 | Mankin et al. |
| 8,482,923 B2 | 7/2013 | Tan et al. |
| 2003/0150645 A1 | 8/2003 | Chiu |
| 2003/0189246 A1* | 10/2003 | Iwaki .................... H01L 21/481 257/706 |
| 2004/0099940 A1 | 5/2004 | Standing et al. |
| 2004/0106229 A1 | 6/2004 | Jiang et al. |
| 2004/0111876 A1 | 6/2004 | Cheng et al. |
| 2007/0227761 A1* | 10/2007 | Tuominen .......... H01L 23/5389 174/252 |
| 2007/0253179 A1* | 11/2007 | Briggs .................. H05K 3/305 361/808 |
| 2007/0261235 A1 | 11/2007 | Byrd et al. |
| 2008/0006923 A1 | 1/2008 | Otremba |
| 2008/0128909 A1* | 6/2008 | Hann ................ H01L 21/76844 257/751 |
| 2008/0251893 A1 | 10/2008 | English et al. |
| 2009/0154109 A1 | 6/2009 | Chen et al. |
| 2011/0026232 A1* | 2/2011 | Lin .................... H01L 21/76898 361/760 |
| 2011/0031611 A1* | 2/2011 | Standing ............ H01L 21/4846 257/700 |
| 2011/0197438 A1 | 8/2011 | Kikuchi et al. |
| 2011/0247874 A1* | 10/2011 | Watanabe .................. C09J 9/02 174/267 |
| 2011/0303449 A1 | 12/2011 | Kobayashi et al. |
| 2012/0075807 A1* | 3/2012 | Refai-Ahmed ......... H01L 23/13 361/719 |
| 2012/0266459 A1 | 10/2012 | Bessette et al. |
| 2013/0155723 A1 | 6/2013 | Coleman |
| 2013/0242496 A1 | 9/2013 | Ahmad et al. |
| 2013/0343000 A1* | 12/2013 | Shi ..................... H01L 23/3677 361/717 |
| 2014/0168920 A1 | 2/2014 | Hondo |
| 2015/0028487 A1* | 1/2015 | Meyer-Berg ...... H01L 23/49861 257/773 |

\* cited by examiner

US 9,974,190 B2

1

SYSTEM AND METHOD OF PROVIDING A SEMICONDUCTOR CARRIER AND REDISTRIBUTION STRUCTURE

BACKGROUND

An electronic component may include one or more semiconductor devices in a package. The package includes internal electrical connections from the semiconductor device to a substrate or a leadframe which includes outer contacts. The outer contacts are used to mount the electronic component on a redistribution board, such as a printed circuit board. The package may include a housing which covers the semiconductor device and the internal electrical connections. The housing may include a plastic material, such as epoxy resin, and may be formed by a mold process, such as injection molding.

SUMMARY

In an embodiment, a method includes arranging a first carrier on a first major surface of a circuit board such that an electronic component arranged on the first carrier is positioned in an aperture in the circuit board and spaced apart from side walls of the aperture, and arranging a second carrier on a second major surface of the circuit board such that the second carrier covers the electronic component and the aperture, the second major surface of the circuit board opposing the first major surface of the circuit board. The electronic component includes a power semiconductor device embedded in a dielectric core layer and at least one contact pad arranged on a first major surface of the dielectric core layer.

In an embodiment, a system includes an electronic component including a power semiconductor device embedded in a dielectric core layer, a first carrier including at least one contact arranged in a peripheral region which is coupleable to a first major surface of a circuit board, and a second carrier. The electronic component is arranged on the first carrier and is positionable in a through-hole in a circuit board by way of a connection between the first carrier and the circuit board such that the electronic component is spaced from side faces of the through-hole and embedded in the circuit board. The second carrier is sized and shaped to cover the through-hole and the electronic component when arranged on the second major surface of the circuit board.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

2

Figure 6:
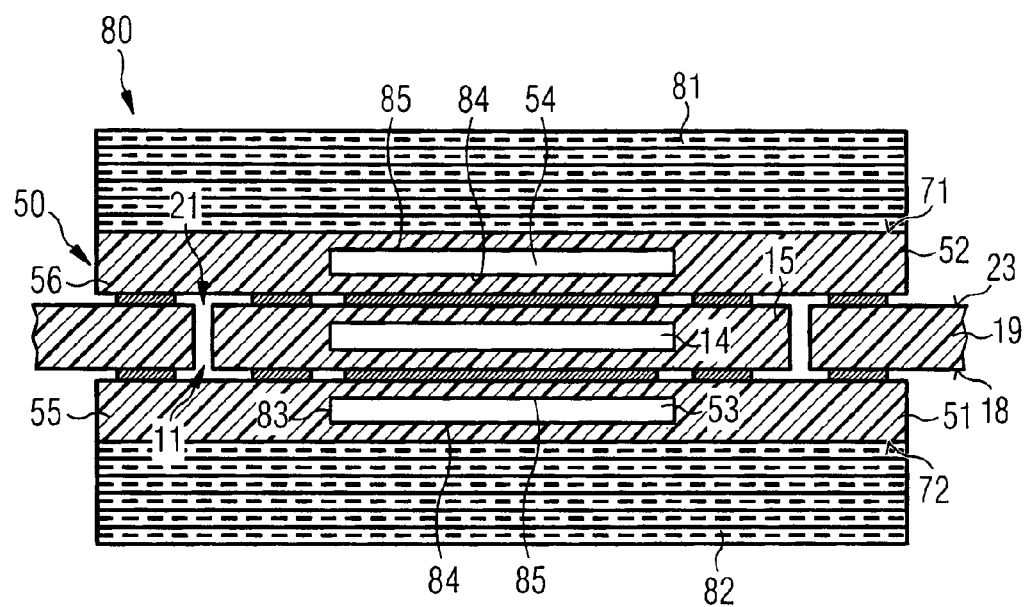

FIG. 6 illustrates a cross-sectional view of an assembled system according to a fourth embodiment.

Figure 7:
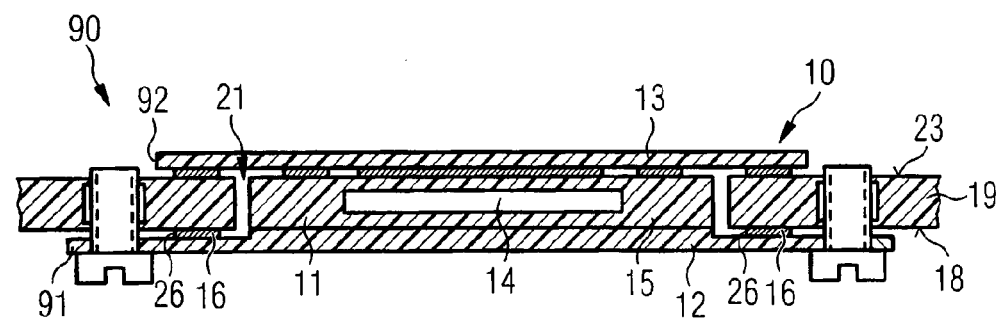

FIG. 7 illustrates a cross-sectional view of a fixture for assembling the system according to the first embodiment.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
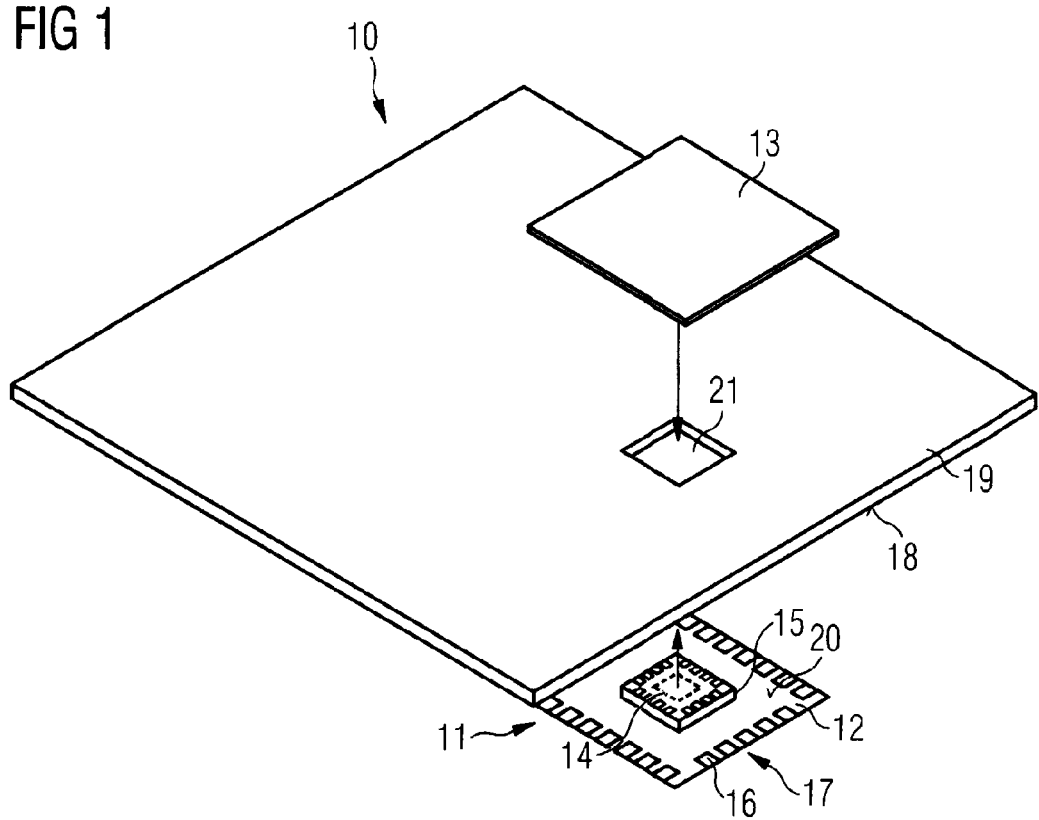
FIG. 1 illustrates a perspective view of a system according to a first embodiment including an electronic component, a first carrier and a second carrier.

FIG. 1 illustrates a perspective view of a system 10 according to a first embodiment including an electronic component 11, a first carrier 12 and a second carrier 13. The electronic component 11 includes a power semiconductor device 14 embedded in a dielectric core layer 15. The first carrier 12 includes at least one contact 16 arranged in a peripheral region 17 of the first carrier 12. The at least one contact 16 may be a surface mountable contact such as a contact pad. In the embodiment illustrated in FIG. 1, a plurality of contacts 16 are arranged in all four peripheral regions of a substantially square first carrier 12. In other embodiments, the contacts 16 may be arranged in two opposing peripheral regions.

The electronic component 11 is arranged on the first carrier 12 and, in particular, on the first major surface 20 of the first carrier 12 which includes the contacts 16.

The second carrier 13 is sized and shaped to cover the electronic component 11 and may have assize and shape substantially corresponding to the first carrier 12 or may be laterally smaller or laterally larger than the first carrier 12.

To assemble the system 10 and electrically couple the electronic component 11 to a circuit board 19, the first carrier may be arranged on a first major surface of the circuit board 19, such as a lower surface 18 of the circuit board 19 as illustrated in FIG. 1. The circuit board 19 includes an aperture 21 which is sized and shaped to accommodate the electronic component 11. The at least one contact 16 arranged on the first carrier 12 may be coupled to the lower surface 18 of the circuit board 19 to attach the first carrier 12 to the circuit board 19 and to position the electronic component 11 in an aperture 21 in the circuit board 19.

Figure 2:
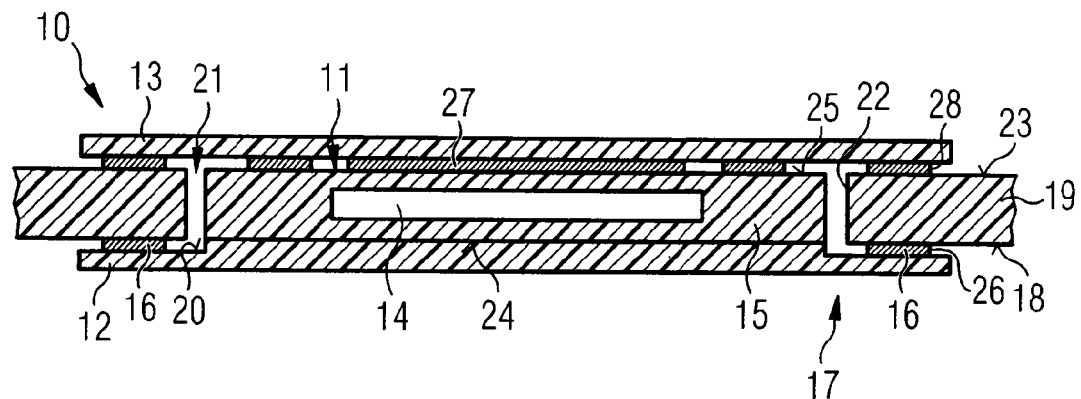
FIG. 2 illustrates a cross-sectional view of the assembled system according to the first embodiment.

The electronic component 11 is positionable in the aperture 21 arranged in the circuit board 19 by way of the connection between the first carrier 12 and the circuit board 19. The aperture 21, the electronic component 11 and the first carrier are sized and shaped with respect to one another such that the electronic component 11 is spaced from side walls 22 of the aperture 21 and is embedded in the circuit board 19, as can be seen in the cross-sectional view of the assembled system 10 in FIG. 2. The aperture 21, the electronic component 11 and the first carrier are sized and shaped with respect to one another such that the peripheral region 17 of the first carrier 12 is in contract with the lower surface 18 of the circuit board 19 in regions adjacent to the aperture 21. The electronic component 11 is embedded within the volume of the circuit board 19 by a surface mountable contact between the lower surface 18 of the circuit board 19 the first carrier 12. The second carrier is arranged on the opposing upper surface 23 of the circuit board 19.

When the system 10 is assembled on the circuit board 19, the electronic component 11 is sandwiched between the first carrier 12 and the second carrier 13 such that the electronic component 11 is in physical contact with both the first carrier 12 and the second carrier 13. The electronic component 11 is not in direct contact with the material of the circuit board 19 but is positioned within the aperture 21 by means of the physical connection between the first carrier 12 and the circuit board 19.

The electronic component 11 has a height which is substantially similar to the thickness of the circuit board 19 and is embedded within the volume of the circuit board 19. A first major surface 24 of the dielectric core layer 15 is substantially coplanar with the lower surface 18 of the circuit board 19 and a second major surface 25 of the dielectric core layer 15 is substantially coplanar with the upper surface 23 of the circuit board 19.

The electronic component 11 may be mounted on the first major surface 20 of the first carrier 12, for example by adhesive, or may be integral with the first carrier 12. The first carrier 12 and the second carrier 13 may include the same or different materials. The first carrier 12 and the second carrier 13 may include a dielectric material which is typically used to manufacture circuit boards 19.

The electronic component 11 has a substantially planar rectangular form which is substantially defined by the shape of the dielectric core layer 15. The dielectric core layer 15 may include a substantially planar prefabricated board including a material such as glassfibre reinforced matrix, or other material, which is typically used to fabricate circuit boards such as the circuit board 19. For example, the dielectric core layer may include a glass fibre reinforced epoxy resin, such as FR4. The dielectric core layer may include PTFE (Polytetrafluoroethylene), PEN (Polyethylene Naphthalate), PET (Polyethylene Terephthalate, BT laminate (Bismaleimide-Triazine) or Polyimide, for example.

In some embodiments, the first carrier 12, the second carrier 13, the dielectric core layer 15 of the electronic component 11 and the circuit board 19 include the same dielectric material. These embodiments may be useful in reducing stress caused by differing thermal expansion coefficients.

The electronic component 11 includes one or more power semiconductor devices 14 embedded in the dielectric core layer 15. The power semiconductor device 14 may be a power transistor device, for example. The power semiconductor device 15 may include a transistor device, such as a power transistor device having a vertical current path. The power transistor device may include a MOSFET, an Insulated Gate Bipolar Transistor (IGBT) or a Bipolar Junction Transistor (BJT).

The power semiconductor device 14 may be embedded directly in the dielectric core layer 15 and be in direct contact with the material of the dielectric core layer 15 or the power semiconductor device 14 may be positioned in an aperture in the dielectric core layer 15. The regions between the side walls of the aperture and the power semiconductor device may be filled with adhesive or a dielectric material such as a polyimide.

The electronic component 11 is not limited to including a single power semiconductor device 14 but may include more than one semiconductor device embedded in the dielectric core layer 15. For example, the electronic component 11 may include two or more power transistor devices, a power transistor device and a diode or one or more power transistor devices and a control chip. The power semiconductor device and further semiconductor devices may be electrically coupled to form a circuit or part of a circuit, for example a half-bridge or a cascode configuration.

In some embodiments, the electronic component 11 is electrically coupled to the at least one contact 16 by way of a redistribution structure arranged between contact pads of the electronic component 11 and the least one contact pad 16 arranged in the peripheral region 17 of the first carrier 12. The least one contact 16 may be electrically coupled to a conductive redistribution structure of the circuit board 19 such that the electronic component 11 is electrically coupled to the redistribution structure of the circuit board 19 by way of the first carrier 12.

The second carrier 13 may include one or more contacts and may further include a conductive redistribution structure which may be used to electrically couple the electronic component 11 to one or more contacts arranged on the upper surface 23 of the circuit board 19 and the conductive redistribution structure of the circuit board 19. The electronic component 11 may be electrically coupled to the redistribution structure of the circuit board 19 by way of both the first carrier 12 and the second carrier 13.

In some embodiments, the second carrier 13 includes electrically insulative material only and does not part provide a conductive redistribution function.

The first carrier 12, the electronic component 11 and the second carrier 13 may be provided in the form of the kit for assembly on circuit boards providing different circuits. For example, the electronic component 11 may include a single transistor or may include two or more power semiconductor devices electrically coupled to provide a circuit or portion of a circuit. For example, the electronic component 11 may include two power transistor devices electrically coupled to form a half-bridge circuit. The electronic component may be mounted in the aperture 21 of the circuit board 19 and electrically coupled with the further components and the conductive redistribution structure of the circuit board 19 to provide circuits for differing applications such as, a voltage regulator.

Whilst one aperture 21 and a single kit for the system 10 is illustrated in FIG. 1 in connection with the circuit board 19, two or more kits may be provided for use with corresponding apertures in the circuit board.

The system 10 may be used by applying the first carrier 12 on the first major surface 18 of the circuit board 19 such that the electronic component 11 is positioned in the aperture 21 in the circuit board 19 and spaced apart from side walls 22 of the aperture 21. The second carrier 13 is arranged on the second major surface 23 of the circuit board 19 such that the second carrier 13 covers the electronic component 11 and the aperture 21.

At least one contact pad 16 arranged on the first carrier may be electrically coupled with the redistribution structure arranged on the first major surface 18 of the circuit board 19. The circuit board 19 may include an arrangement of contact pads which correspond to the arrangement of contact pads 16 arranged in one or more peripheral regions 17 of the first carrier 12. For example, the contact 16 may be electrically coupled to a corresponding contact pad 26 arranged adjacent the aperture 21 on the second first major surface 18 of the circuit board 19.

The electrical connection between the contact pads 16, 26 may also detachably attach the first carrier 12 to the first major surface 18 of the circuit board 19. A detachable attachment may be useful to replace a defective electronic component 11 or to change the type of electronic component 11 or rating of the electronic component 11 in the application provided by the circuit board 19. For example, if a soft solder is used to electrically couple the contact pads 16, 26 and the first carrier 12 to the first major surface 18 of the circuit board 19, the first carrier 12 can be removed from the circuit board 19 and the electronic component 11 can be removed from the aperture 21 by heating solder connection above melting point of the solder.

The electronic component 11 includes one or more contacts, for example a contact pad 27, arranged on the second major surface 25 of the dielectric core layer 15. This contact pad 27 may be electrically coupled to the contact pad 28 arranged adjacent the aperture 21 on the second major surface 23 of the circuit board 19 by means of the second carrier 13 and, in particular, a redistribution structure arranged on the major surface of the second carrier 13 which faces towards and is electrically coupled to both the contact pad 27 arranged on the second major surface 25 of the electronic component 11 and the contact pads 28 arranged on the upper surface 23 of the circuit board 19. The electronic component 11 and the power semiconductor device 14 to the contact pad 28 by the second carrier 13.

Figure 3:
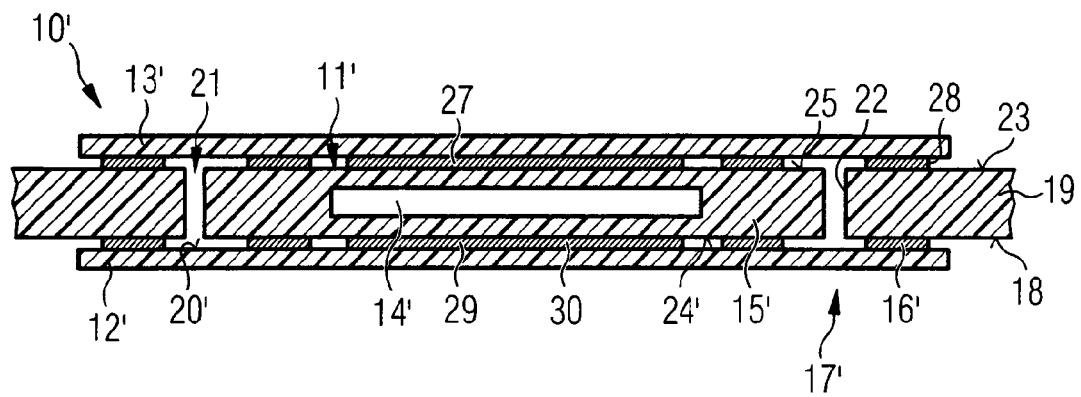
FIG. 3 illustrates cross-sectional view of an assembled system according to a second embodiment.

FIG. 3 illustrates cross-sectional view of a system 10' according to a second embodiment. The system 10' differs from the system 10 of the first embodiment in that the electronic component 11' includes one or more contacts 27 on the second major surface 25 and one or more contacts 29 on the lower surface 24 of the dielectric core layer 15'. The one or more contacts 29 are electrically coupled to one or more corresponding contact pads 30 arranged on the first major surface 20' of the first carrier 12'. The contacts 29 and contacts 30 may include contact pads and may be electrically coupled to one another by the same type of connection which is used to couple the contact pads 16' of the first carrier 12' to the contact pads 26 arranged on the lower surface 18 of the circuit board 19, for example, a soft solder connection may be used.

The electronic component 11' may be electrically coupled by means of the contact pads 29, 30 to a conductive redistribution structure of the circuit board 19 which cannot be seen in the cross-sectional view of FIG. 3.

Figure 4:
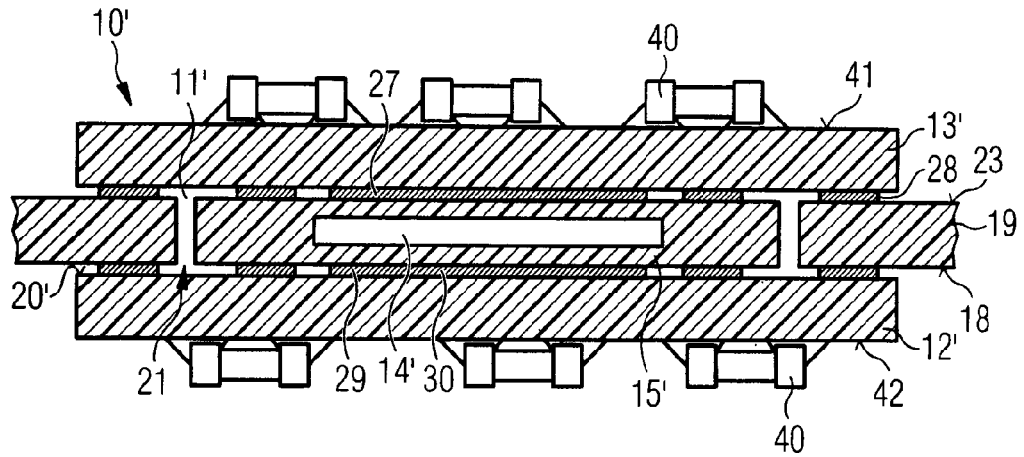
FIG. 4 illustrates a cross-sectional view of the assembled system according to the second embodiment with additional devices.

FIG. 4 illustrates a cross-sectional view of the assembled system 10' according to the second embodiment with additional devices 40. The additional devices 40 are arranged on the outwardly facing major surfaces 41, 42 of the second carrier 13 and the first carrier 12, respectively. The additional devices may be considered to be stacked on the electronic component 11'.

The additional devices 40 may be active devices, such as transistor devices or diodes or may be passive devices such as inductors, capacitors and resistors. One or more of the additional devices 40 may be electrically coupled to the conductive redistribution structure of the carrier on which it is mounted.

One or more of the additional devices 40 may be electrically coupled in a circuit with the electronic component 11. The first carrier 12' and the second carrier 13' may include a conductive redistribution structure which is electrically coupled to the one or more further devices 40 and which electrically couples the one or more devices 40 to the redistribution structure of the circuit board 19. One or more of the first carrier 12' and the second carrier 13' may also include a conductive redistribution structure to electrically couple the one or one or more of the additional devices 40 to the power semiconductor device 14' embedded within the dielectric core layer 15'. One or more of the additional devices 40 may be electrically coupled to the electronic component 11' and the circuit board 19 by means of one or both of the first carrier 12' and the second carrier 13'.

Figure 5:
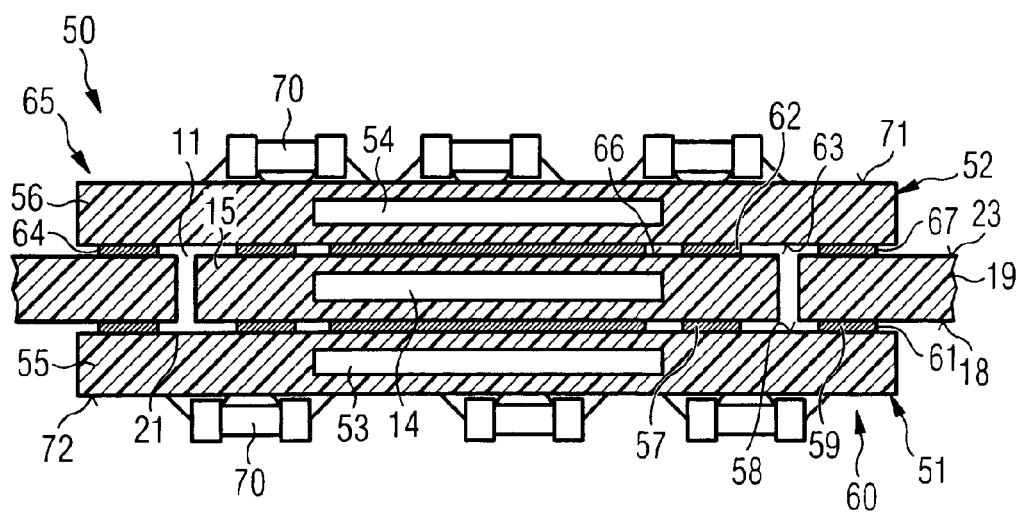
FIG. 5 illustrates a cross-sectional view of an assembled system according to a third embodiment.

FIG. 5 illustrates a cross-sectional view of a system 50 according to a third embodiment in the assembled state. The system 50 includes the electronic component 11, as is illustrated in FIG. 3, a first carrier 51 and a second carrier 52 which can be supplied as a kit for assembly on a circuit board 19. The electronic component is mounted on the first carrier 51.

Each of the first carrier 51 and second carrier 52 includes a semiconductor die 53, 54 embedded in a dielectric core layer 55, 56. The semiconductor die 53 embedded in the dielectric core layer 55 is electrically coupled to one or more contact pads 57 arranged on the first major surface 58 of the dielectric core layer 55. The one or more contact pads 57 are arranged in the central region of the dielectric core layer 55. One or more further contact pads 59 may be arranged in a peripheral region 60 of the first major surface 58 of the first carrier 51.

The dielectric core layer 55 and the first carrier 51 has a lateral size such that the peripheral region 60 is positioned adjacent the aperture 21 in the circuit board 19 and such that the first carrier 51 may be attached to the lower surface 18 of the circuit board 19 by connections between the contact pads 59 arranged in the peripheral region 60 and corresponding contact pads 61 arranged adjacent the aperture 21 on the lower surface 18 of the circuit board 19.

The electronic component 11 and the aperture 21 have lateral dimensions such that the side faces of the electronic component 11 are spaced at a distance from the side walls 22 defining the aperture 21 when the electronic component 11 is arranged in the aperture 21. The first carrier 51 has lateral dimensions such that the peripheral region 60 of the first carrier is arranged on the lower surface 24 of the circuit board adjacent the aperture 21 when the electronic component 11 is positioned in the aperture 21.

The second carrier 52 is arranged on the upper surface 23 of the circuit board 19. The second carrier 52 also includes contacts 62 arranged on the lower surface 63 of the dielectric core layer 56 in the central region and one or more contacts 64 arranged on a peripheral region 65 of the dielectric core layer 56. One or more of the contacts 62, 64 may be electrically coupled to the semiconductor die 54 embedded in the dielectric core layer 56. The contacts 62 arranged on the lower surface 63 may be electrically coupled to contact pads 62 arranged on the upper surface 66 of the electronic component 11. The contacts 64 arranged in the peripheral region 65 may be arranged on contact pads 67 arranged on the upper surface 24 of the circuit board 19 adjacent to the aperture 21. The electronic component 11 is, in the assembled condition, sandwiched between the first carrier 51 and the second carrier 22 and is positioned in the aperture 21 so as to be embedded in the circuit board 19.

The electronic component 11 is electrically and mechanically coupled to both the first carrier 51 and the second carrier 52 in the assembled condition and is positioned directly on the contacts 57 on the first carrier 51 and contacts 62 on the second carrier 52. The semiconductor devices 14, 53, 54 are embedded in the dielectric core layers 15, 55, 56, respectively, and are arranged in a stack in the assembled system 50. The semiconductor devices 14, 53, 54 may be electrically coupled to one another by means of a conductive redistribution structure provided by the contact pads 57, 61, 62, 64, 67 and non-illustrated conductive traces of the first carrier 51, second carrier 52 and circuit board 19.

The system 50 illustrated in the assembled condition in FIG. 5 provides a dense packing arrangement of the semiconductor devices 14, 53, 54 since the first carrier 51, the second carrier 52 and the electronic component 11 each include a substantially planar dielectric core layer, in which the semiconductor device 14, 53, 54, respectively, is embedded which has substantially the same thickness as the semiconductor device. Furthermore, the stacked arrangement is compact, since the electronic component 11 is arranged within the volume of the circuit board 19.

In some embodiments, one or more further devices 70 are arranged on one or both of the outwardly facing surface 71 of the second carrier and the outwardly facing surface 72 of the first carrier 51. The further devices may be passive devices or active devices.

The system 50 is not limited to a stack of three embedded semiconductor devices. For example, one of the first carrier 52 or the second carrier 52 may include an embedded semiconductor die whereas the other does not. Further dielectric core layers with or without embedded semiconductor dice may also be mounted used to build up the stack of four or more semiconductor dice.

FIG. 6 illustrates a cross-sectional view of an assembled system 80 according to a fourth embodiment. The system 80 includes the system 50 including the electronic component 11 arranged in an aperture 21 in the circuit board 19, the first carrier 51 which is arranged on the lower surface 18 of the circuit board 19 and covers the aperture 21 and the second carrier 52 which is arranged on the opposing upper surface 23 of the circuit board 19 and covers the aperture 21. The first carrier 51 includes the semiconductor device 53 embedded in the dielectric core layer 55 and the second carrier 52 includes a semiconductor die 54 embedded in a dielectric core layer 56.

The system 80 further includes heat spreader layers 81, 82 arranged on the outwardly facing surfaces 71, 72 of the second carrier 52 and first carrier 51, respectively.

The heat spreader layers 81, 82 may be applied to the first carrier 51 and second carrier 52 before or after the first carrier 51 and second carrier 52 are arranged on the circuit board 19.

The heat spreader layers 81, 82 may be applied to the outwardly facing surface 71, 72 of the dielectric core layers 55, 56 of the first carrier 51 and second carrier 52, respectively. In some embodiments, the heat-spreader layers 81, 82 has a higher thermal conductivity in directions substantially parallel to the major surface 84, 85 of the one or more power semiconductor devices 53, 54 than in directions substantially perpendicular to the major surface 84, 85 of the one or more power semiconductor devices 53, 54.

The heat spreader layers 81, 82 may be configured to conduct heat to areas adjacent the side faces 83 of the power semiconductor devices 53, 54. For example, the heat spreaders 81, 82 may each have a lateral area which is greater than that of the power semiconductor devices 53, 54 which in combination with the anisotropic thermal conductivity may be used to assist the conduction of heat from the power semiconductor device 53, 54 to regions of the heat-spreader layer 81, 82 adjacent the side faces 83 of the power semiconductor device 53, 54.

This anisotropic thermal conductivity may be provided by particles having anisotropic thermal conductivity and an anisotropic arrangement such that the heat-spreader has an average anisotropic thermal conductivity. For example, the particles may include graphite particle which have a preferred orientation within the heat spreader layers 81, 82.

Graphite particles typically have a platelet shape in which the long direction has a higher thermal conductivity than the short direction. The platelets may be arranged such that the long directions of the platelets may, on average, extend in directions substantially parallel to the major surfaces 40", 41" of the power semiconductor device 15" and the thickness of the platelets may extend in directions substantially perpendicular to the major surfaces 40", 41" of the power semiconductor device 15".

Graphite behaves has an anisotropic thermal conductivity due to the orientation of the poly crystalline structures substantially arranged in the ab plane and the weak Van der Waals bonds in the c axis which bond the polycrystalline planes to one another. This leads to graphite delaminating and chipping in between poly crystalline planes by breakage of the Van der Waal's forces.

Graphite materials may have a lateral thermal conductivity, i.e. in the long direction, of up to 500 W/m-k for natural graphite and up to 1500 W/m-k for engineered graphite. The thermal conductivity of graphite in the vertical direction, i.e. the short direction of the platelet, is around 10 W/m-k. Therefore, a thermal conduction anisotropic ratio of at least around 50 to 1 may be provided.

In some embodiments, the graphite may be coated and/or the graphite may be sandwiched between two metal sheets, for example copper sheets to improve the workability of the heat-spreader composite. The particles may be sandwiched between a first metallic layer and a second metallic layer of the heat-spreader layer 81, 82.

A heat-sink may also be applied to one or both of the heat spreader layers 81, 82. The heat-sink may have a substantially isotropic thermal conductivity and may assist in dissipating heat from the heat-spreader layers 81, 82 in vertical as well as lateral directions. The heat-sink may also be embedded in a further dielectric core layer.

FIG. 7 illustrates a cross-sectional view of a mounting fixture 90 for the system 10 according to the first embodiment. In the assembled system illustrated in FIG. 2, the first carrier 12, on which the electronic component 11 is mounted, is attached to the circuit board 19 by a soft solder or adhesive joint between the contact pads 16 arranged in a peripheral region 17 of the first carrier 12 and contact pads 26 arranged on the lower surface 18 of the circuit board 19 adjacent to the aperture 21. The soft solder or adhesive may be removed to remove the electronic component 11 from circuit board 19 and allow reworking of the circuit board 19.

In the embodiment illustrated in FIG. 7, the first carrier 12 is secured to the circuit board 19 by one or more fixtures 90. The fixtures 90 are mechanical fixtures which may have the form of a screw, or nut and bolt. The fixture 90 extends through peripheral regions 91 of the first carrier 12 which are peripheral to the contacts 16. The lateral extent of the first carrier 12 is larger than the lateral extent of the second carrier 13 so that the mechanical fixtures 90 are arranged in the circuit board 19 adjacent to the peripheral rim 92 of the second carrier 13.

The first carrier 12 and, in particular the contacts 16, is electrically coupled to the circuit board 19, in particular the contacts 26, by way of a purely mechanical surface to surface connection between the contacts 16, 26. The electronic component may be removed from the circuit board 19 by removing the fixtures 90.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    arranging a first carrier on a first major surface of a circuit board such that an electronic component arranged on the first carrier is positioned in an aperture in the circuit board and spaced apart from side walls of the aperture, the electronic component comprising a power semiconductor device and a dielectric core layer, the power semiconductor device embedded in the dielectric core layer, the dielectric core layer distinct from the circuit board and spaced apart from side walls of the aperture, and at least one contact pad arranged on a first major surface of the dielectric core layer;
    arranging a second carrier on a second major surface of the circuit board such that the second carrier covers the electronic component and the aperture, the second major surface of the circuit board opposing the first major surface of the circuit board; and
    electrically coupling a semiconductor device embedded in the second carrier to the redistribution structure arranged on the second major surface of the circuit board by way of the redistribution structure of the second carrier.

2. The method according to claim 1, further comprising electrically coupling the semiconductor device embedded in the second carrier to the power semiconductor device embedded in the dielectric core layer of the electronic component.

3. The method according to claim 1, wherein at least one of the first carrier and the second carrier is detachably attached to the first major surface of the circuit board by solder or adhesive.

4. The method according to claim 1, further comprising electrically coupling at least one contact arranged on the first carrier with a redistribution structure arranged on the first major surface of the circuit board.

5. The method according to claim 1, further comprising electrically coupling the at least one contact pad on the first major surface of the dielectric core layer to the redistribution structure arranged on the second major surface of the circuit board.

6. The method according to claim 1, wherein the at least one contact pad on the first major surface of the dielectric core layer is electrically coupled to the redistribution structure arranged on the second major surface of the circuit board by way of the redistribution structure of the second carrier.

7. The method according to claim 1, further comprising arranging a further component on a major surface of at least one of the first carrier and the second carrier.

8. A method, comprising:
    arranging a first carrier on a first major surface of a circuit board such that an electronic component arranged on the first carrier is positioned in an aperture in the circuit board and spaced apart from side walls of the aperture, the electronic component comprising a power semiconductor device and a dielectric core layer, the power semiconductor device embedded in the dielectric core layer, the dielectric core layer distinct from the circuit board and spaced apart from side walls of the aperture, and at least one contact pad arranged on a first major surface of the dielectric core layer;
    arranging a second carrier on a second major surface of the circuit board such that the second carrier covers the electronic component and the aperture, the second major surface of the circuit board opposing the first major surface of the circuit board; and
    electrically coupling a semiconductor device embedded in the first carrier to the redistribution structure arranged on the first major surface of the circuit board by way of a redistribution structure of the first carrier.

9. The method according to claim 8, further comprising electrically coupling the semiconductor device embedded in the first carrier to the power semiconductor device embedded in the dielectric core layer of the electronic component.

10. A system, comprising:
an electronic component comprising a power semiconductor device and a dielectric core layer, the power semiconductor device embedded in the dielectric core layer;
a first carrier comprising at least one contact arranged in a peripheral region which is coupleable to a first major surface of a circuit board;
a second carrier; and
a further power semiconductor device embedded in one or more of the first carrier and the second carrier,
wherein the electronic component is arranged on the first carrier and is positionable in a through-hole in a circuit board by way of a connection between the first carrier and the circuit board such that the electronic component is spaced from and not making contact with side faces of the through-hole and embedded in the circuit board and wherein the second carrier is sized and shaped to cover the through-hole and the electronic component when arranged on a second major surface of the circuit board.

11. The system according to claim 10, wherein the further power semiconductor device is electrically couplable to the power semiconductor device embedded in the dielectric core layer.

12. The system according to claim 10, wherein the electronic component is attached to the first carrier by one of a group consisting of electrically insulating adhesive, electrically conductive adhesive and soft solder.

13. The system according to claim 10, wherein the electronic component is sized and shaped to be positioned in the through-hole-in the circuit board such that a first major surface of the dielectric core layer is substantially coplanar with the second major surface of the circuit board when the peripheral region of the first carrier is arranged on the first major surface of the circuit board adjacent the through-hole.

14. The system according to claim 10, wherein the second carrier comprises a conductive redistribution structure which is electrically couplable with the power semiconductor device and a redistribution structure arranged on the second major surface of the circuit board.

15. The system according to claim 10, further comprising one or more further electronic components arranged on at least one of the first carrier and the second carrier.

16. The system according to claim 10, further comprising at least one of a heat sink and a heat dissipator thermally coupled to the electronic component.

17. The system according to claim 10, wherein the electronic component comprises one or more of: a MOSFET, an Insulated Gate Bipolar Transistor (IGBT), a Bipolar Junction Transistor (BJT), a power transistor, a diode, and a control chip.

18. The system according to claim 10, wherein the dielectric core layer comprises one or more of: glassfibre reinforced matrix, glass fibre reinforced epoxy resin, PTFE (Polytetrafluoroethylene), PEN (Polyethylene Naphthalate), PET (Polyethylene Terephthalate, BT laminate (Bismaleimide-Triazine) and Polyimide.

19. A system, comprising:
an electronic component comprising a power semiconductor device and a dielectric core layer, the power semiconductor device embedded in the dielectric core layer;
a first carrier comprising at least one contact arranged in a peripheral region which is coupleable to a first major surface of a circuit board;
a second carrier; and
at least one contact on a second major surface of the dielectric core layer which is electrically couplable to the first major surface of the circuit board by way of a redistribution of the first carrier,
wherein the electronic component is arranged on the first carrier and is positionable in a through-hole in a circuit board by way of a connection between the first carrier and the circuit board such that the electronic component is spaced from and not making contact with side faces of the through-hole and embedded in the circuit board and wherein the second carrier is sized and shaped to cover the through-hole and the electronic component when arranged on a second major surface of the circuit board.

* * * * *